(12) United States Patent
Chen et al.

(10) Patent No.: US 7,583,498 B2
(45) Date of Patent: Sep. 1, 2009

(54) COMPUTER CASING WITH A BACKSIDE COOLING CPU HEAT DISSIPATING FUNCTION

(75) Inventors: Wen-Bin Chen, Taoyuan (TW); Yung-Wei Liu, Taoyuan (TW)

(73) Assignee: Solleron Corporation, Taoyuan (TW)

( * ) Notice: Subject to any disclaimer, the term of this patent is extended or adjusted under 35 U.S.C. 154(b) by 0 days.

(21) Appl. No.: 12/046,604

(22) Filed: Mar. 12, 2008

(65) Prior Publication Data

US 2008/0253084 A1 Oct. 16, 2008

(30) Foreign Application Priority Data

Apr. 13, 2007 (TW) .............................. 96205908 U

(51) Int. Cl.
*H05K 7/20* (2006.01)
(52) U.S. Cl. .................. 361/679.48; 361/694; 361/695; 454/184
(58) Field of Classification Search ............ 361/679.46, 361/679.48, 694, 695; 454/184
See application file for complete search history.

(56) References Cited

U.S. PATENT DOCUMENTS

| | | | | |
|---|---|---|---|---|
| 6,115,205 A * | 9/2000 | Waugh et al. | ............ | 360/78.06 |
| 6,115,250 A * | 9/2000 | Schmitt | ....................... | 361/695 |
| 6,356,435 B1 * | 3/2002 | Davis et al. | ................. | 361/678 |
| 6,406,257 B1 * | 6/2002 | Houdek | ................... | 415/213.1 |
| 6,616,525 B1 * | 9/2003 | Giraldo et al. | .............. | 454/184 |
| 6,839,233 B2 * | 1/2005 | Cravens et al. | .............. | 361/695 |
| 7,304,843 B2 * | 12/2007 | Peng et al. | ............. | 361/679.48 |
| 7,466,545 B2 * | 12/2008 | Hung | .................... | 361/679.48 |
| 2003/0043540 A1 * | 3/2003 | Chen et al. | ................... | 361/687 |
| 2003/0161103 A1 * | 8/2003 | Wrycraft et al. | ............ | 361/695 |
| 2005/0041392 A1 * | 2/2005 | Chen | ......................... | 361/695 |

* cited by examiner

*Primary Examiner*—Gregory D Thompson

(57) ABSTRACT

A computer casing includes a casing body and a housing covered onto the exterior of the casing body. The casing body constitutes a support framework of the computer casing and includes a sidewall disposed on an internal side of the casing body of the computer casing for erecting a computer panel. The sidewall includes a fan aligning portion having a plurality of ventilation holes. The fan aligning portion is disposed on the computer panel and at a position corresponding to the backside of a central processing unit (CPU) for installing a fan to assist the heat dissipation of the CPU.

6 Claims, 4 Drawing Sheets

COMPUTER CASING WITH A BACKSIDE COOLING CPU HEAT DISSIPATING FUNCTION

BACKGROUND OF THE INVENTION

1. Field of the Invention

The present invention generally relates to a computer, and more particularly to a casing of a computer system having a fan installed for dissipating heat inside the computer casing.

2. Description of Prior Art

As science and technology advance, a computer with a fast computing speed and a large data storage capacity has become an indispensable tool to our work and daily life. Further, the performance of a central processing unit (CPU) on a computer panel is enhanced, and the heat generated by the operation of the CPU becomes increasingly large.

Although heat dissipating devices such as fans and heat sinks are designed and installed to the present computer casings, such devices are limited for dissipating the heat from the casing to the outside only, and seldom can dissipate the heat directly from the CPU on a computer panel. Particularly, when the computer penal is attached onto a sidewall of the casing, the backside of the CPU generally has very little heat dissipation effect, and thus the heat source is centralized at the backside of the CPU and adversely affects the normal operation of the CPU.

In view of the shortcomings of the prior art, the inventor of the present invention based on years of experience in the related industry to conduct extensive researches and experiments, and finally developed a computer casing with a backside cooling CPU heat dissipating function to overcome the shortcomings of the present invention.

SUMMARY OF THE INVENTION

It is a primary objective of the present invention to overcome the foregoing shortcomings by providing a computer casing with a backside cooling CPU heat dissipating function, wherein the computer casing provides a fan aligning portion for installing a fan, and the fan aligning portion is aligned with a CPU installed at the backside of a computer panel for dissipating heat as well as cooling the computer panel.

To achieve the foregoing objective, the present invention provides a computer casing with a backside cooling CPU heat dissipating function, comprising a casing body that constitutes a support framework of the computer casing, and a housing covered onto the exterior of the casing body. The casing body includes a sidewall disposed on an internal side of the casing body for erecting a computer panel, and the sidewall includes a fan aligning portion with a plurality of first ventilation holes; wherein the fan aligning portion is disposed at a position corresponding to the backside of the CPU on the computer panel for installing a fan thereon.

DETAILED DESCRIPTION OF THE INVENTION

The technical characteristics, features and advantages of the present invention will become apparent in the following detailed description of the preferred embodiments with reference to the accompanying drawings.

Figure 1:
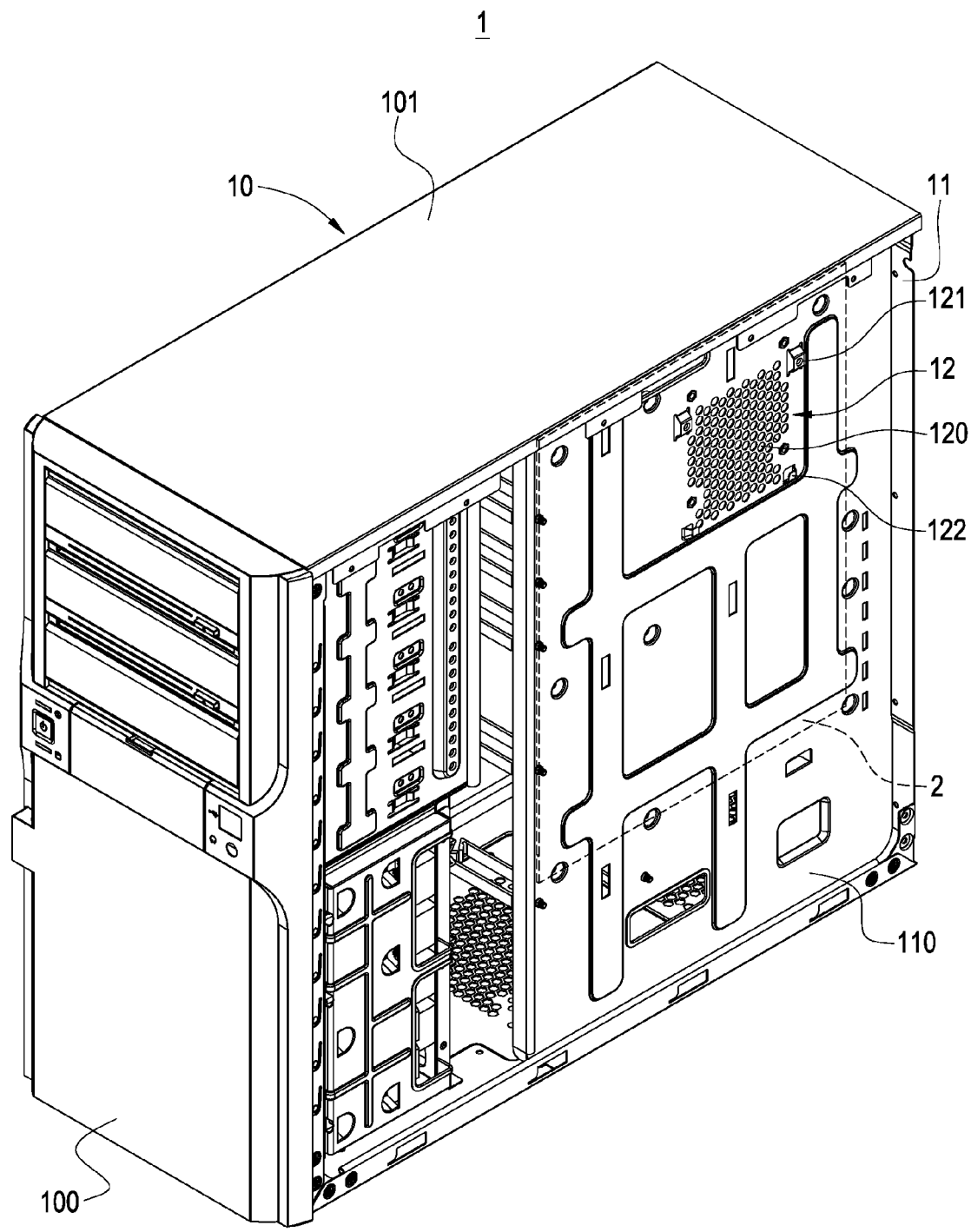
FIG. 1 is a perspective view of a computer casing without installing a fan in accordance with the present invention.
Figure 2:
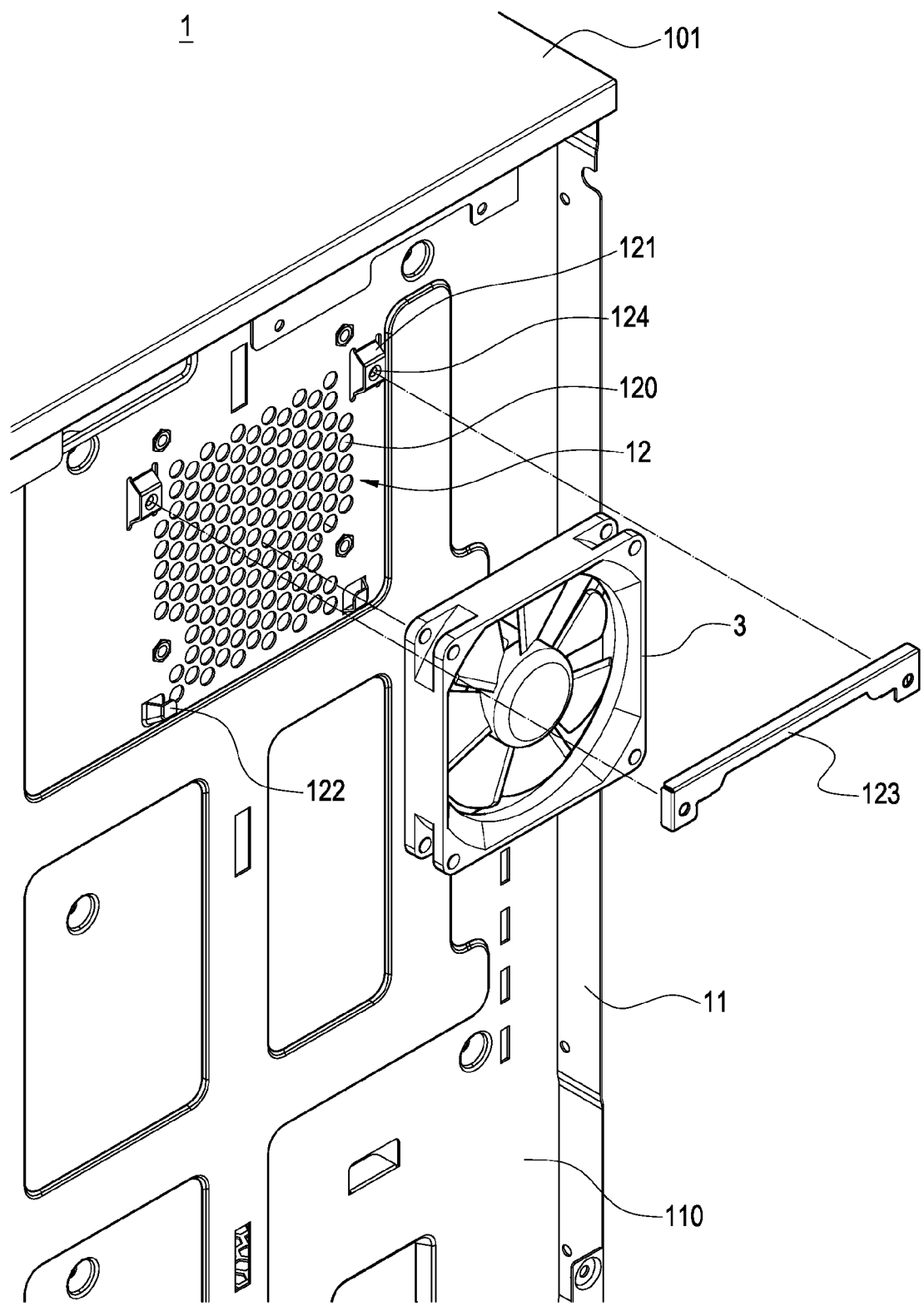
FIG. 2 is an enlarged view of a portion of a computer casing with an installed fan in accordance with the present invention.
Figure 3:
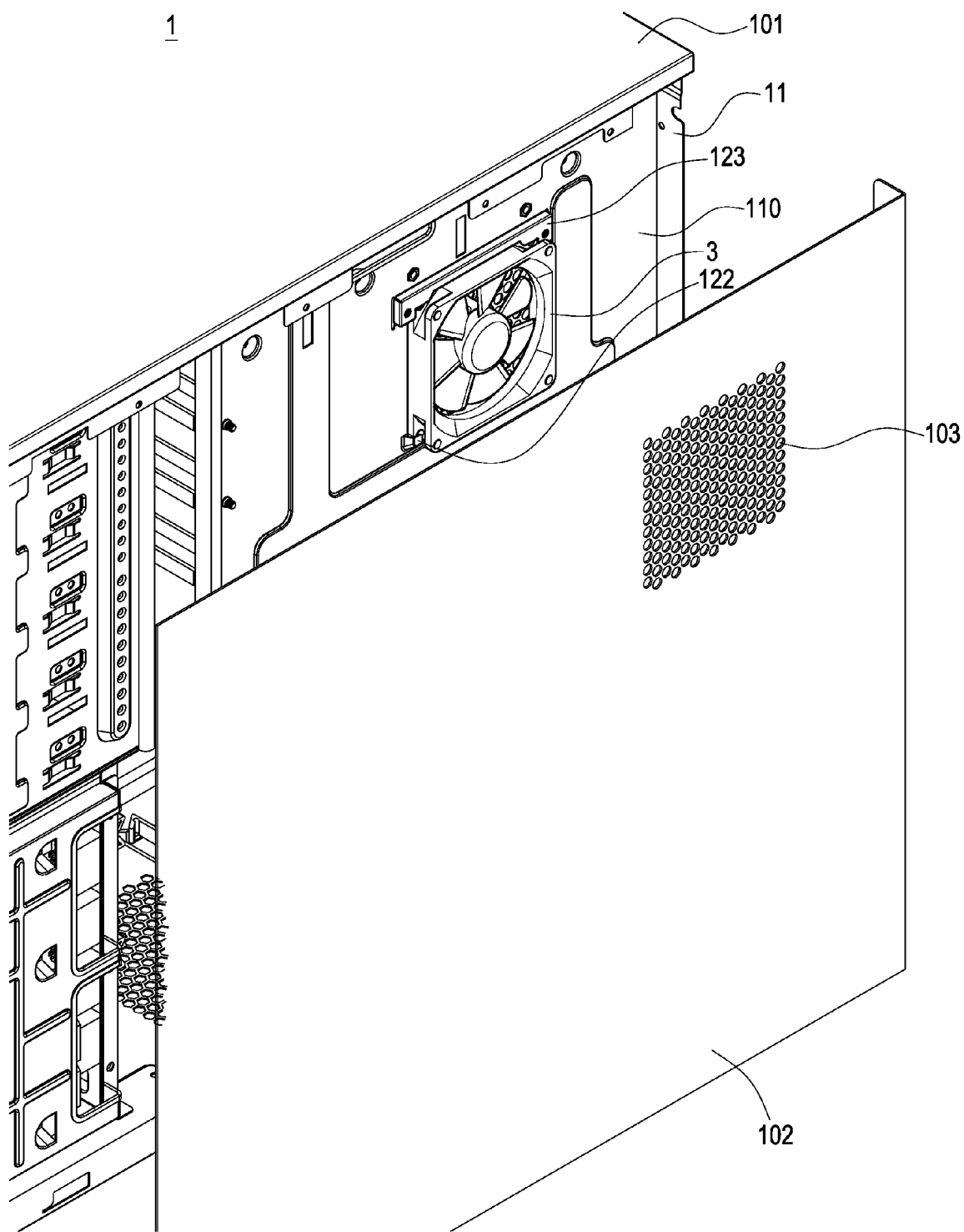
FIG. 3 is an enlarged view of a portion of a computer casing with installed fan and side panel in accordance with the present invention.
Figure 4:
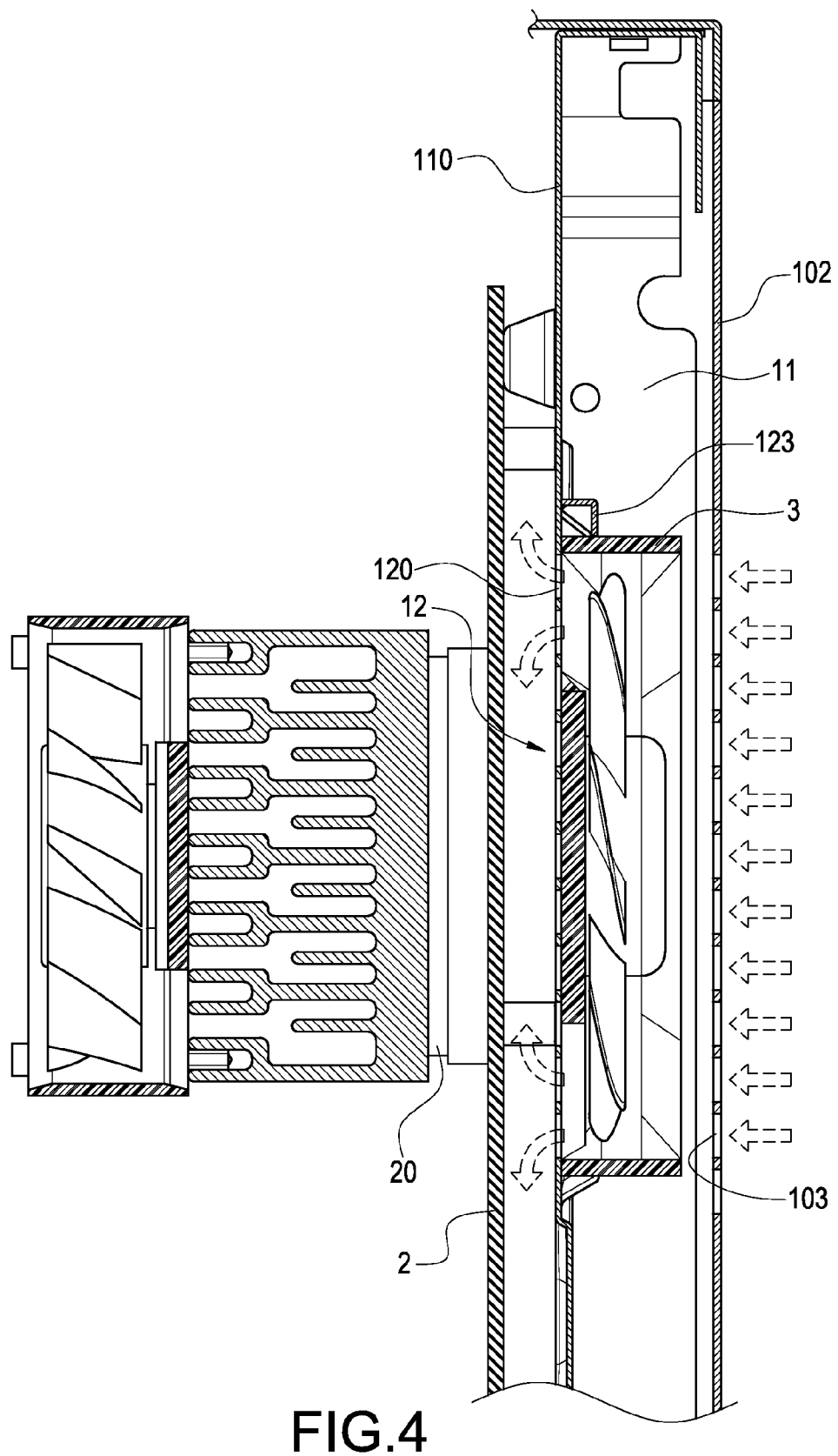
FIG. 4 is a cross-sectional view of using a computer casing in accordance with the present invention.

Referring to FIGS. 1 to 3 for a perspective view of a fan and enlarged views of a portion of an installed fan in accordance with the present invention respectively, the invention provides a computer casing with a backside cooling CPU heat dissipating function, and the computer casing 1 has a fan aligning portion 12 for installing a fan 3, and the fan aligning portion 12 is disposed at a position corresponding to the backside of a CPU 20 installed on a computer panel 2 (as shown in FIG. 4) for dissipating heat produced by the CPU 20.

In FIG. 1, the computer casing 1 comprises a housing 10 and a casing body 11, wherein the housing 10 comprises a front panel 100, a top panel 101 and two left and right side panels 102 (as shown in FIG. 3, and another side panel is not shown in the figure), and the casing body 11 constitutes a support framework of the computer casing 1 for installing necessary components in the computer. The front panel 100, top panel 101 and two side panels 102 of the housing 10 are installed at the front, top, left and right sides of the casing body 1 respectively for covering the exterior of the casing body 11, and the casing body 11 includes a sidewall 110 disposed on an internal side of the casing body 11 for erecting a computer panel 2.

In FIG. 2, the sidewall 110 of the casing body 11 has a fan aligning portion 12 for installing a fan 3, and the fan aligning portion 12 is disposed at a position corresponding to the backside of a CPU 20 installed on the computer panel 2 (as shown in FIG. 4), and the fan aligning portion 12 includes a plurality of first ventilation holes 120, and the periphery of the first ventilation holes 120 installs positioning structures 121, 122 corresponding to the fan 3. In this preferred embodiment, the two positioning structures 121 disposed proximate to the top of the first ventilation holes 120 are protruding stairs, each having a screw hole 124 thereon, and the two positioning structures 122 disposed proximate to the top of the first ventilation holes 120 are protruding frame corners, and the fan 3 is installed onto the two frame corners and the upper edge of the fan 3 is attached onto the sidewall 110 by a transverse locking bar 123 and secured by locking device such as screws.

In FIG. 3, after the fan 3 is fixed onto the fan aligning portion 12, one of the two side panels 103 of the housing 10 disposed proximate to the sidewall 110 is installed onto the casing body 11, and the side panel 103 includes a plurality of second ventilation holes 103 disposed at positions corresponding to the fan 3, such that cool air from the outside can be drawn into each second ventilation hole 103 by the fan 3.

With the foregoing assembly, the computer casing with a backside cooling CPU heat dissipating function in accordance with the present invention can be achieved.

In FIG. 4, the invention makes use of the space between the housing 10 and the casing body 11 of the computer casing 1 to install the fan 3 onto the sidewall 110 of the casing body 11, so that the fan 3 is aligned with the backside of the CPU 20 on the computer panel 2. When the CPU 20 starts operating, the heat dissipating device originally installed on the CPU 20 can provide the heat dissipating effect. In addition, the fan 3 operated with a circuit in accordance with the invention starts operating to draw cool air from the outside to the inside of the casing body 11 through the second ventilation holes 103 to dissipate the heat directly from the backside of the CPU 20 and cool the whole computer panel 2.

While the invention is described in by way of examples and in terms of preferred embodiments, it is to be understood that the invention is not limited thereto. On the contrary, the aim is to cover all modifications, alternatives and equivalents falling within the spirit and scope of the invention as defined by the appended claims.

What is claimed is:

1. A computer casing with a backside cooling CPU heat dissipating function, comprising:
   a casing body, being a support framework of the computer casing, and having a sidewall disposed on an internal side of the casing body for a computer panel to be placed thereon, and the sidewall having a fan aligning portion with a plurality of first ventilation holes; and
   a housing, covered onto an exterior of the casing body;
   wherein the fan aligning portion is aligned with the backside of a CPU installed on the computer panel, and a fan is installed on the fan aligning portion.

2. The computer casing with a backside cooling CPU heat dissipating function of claim 1, wherein the housing comprises a front panel, a top panel and two left and right side panels, installed at the front, top, left and right sides of the casing body respectively.

3. The computer casing with a backside cooling CPU heat dissipating function of claim 2, wherein one of the two side panels of the housing disposed proximate to the sidewall includes a plurality of second ventilation holes corresponding to the fan aligning portion.

4. A computer casing with a backside cooling CPU heat dissipating function, comprising:
   a casing body, being a support framework of the computer casing, and having a sidewall disposed on an internal side of the casing body for a computer panel to be placed thereon, and the sidewall having a fan aligning portion with a plurality of first ventilation holes; and
   a housing, covered onto the exterior of the casing body; and
   a fan, installed onto the fan aligning portion,
   wherein two protruding stairs are disposed proximate to the to of the first ventilation holes and two protruding frame corners are disposed proximate to the bottom of the first ventilation holes, and
   wherein the fan is installed onto the two frame corners and an upper edge of the fan is attached onto the sidewall by a transverse locking bar secured to the protruding stairs.

5. The computer casing with a backside cooling CPU heat dissipating function of claim 4, wherein the housing comprises a front panel, a top panel and two left and right side panels, installed at the front, top, left and right sides of the casing body respectively.

6. The computer casing with a backside cooling CPU heat dissipating function of claim 4, wherein one of the two side panels of the housing disposed proximate to the sidewall includes a plurality of second ventilation holes corresponding to the fan aligning portion.

* * * * *